United States Patent [19]

Imada et al.

[11] 4,372,986
[45] * Feb. 8, 1983

[54] POLYVINYL ALCOHOL-CLAD SHAPED ARTICLE OF VINYL CHLORIDE RESIN

[75] Inventors: Kiyoshi Imada, Omiya; Susumu Ueno, Ibaraki; Yasuhide Nishina, Ibaraki; Hirokazu Nomura, Ibaraki, all of Japan

[73] Assignee: Shin-Etsu Chemical Co. Ltd., Tokyo, Japan

[*] Notice: The portion of the term of this patent subsequent to Oct. 6, 1998, has been disclaimed.

[21] Appl. No.: 165,150

[22] Filed: Jul. 1, 1980

[30] Foreign Application Priority Data

Jul. 9, 1979 [JP] Japan ................................. 54-86645

[51] Int. Cl.³ .............................................. B05D 3/06
[52] U.S. Cl. .................................... 427/40; 427/322; 428/516; 428/520
[58] Field of Search .................. 427/40, 322; 428/518, 428/520; 204/169

[56] References Cited

U.S. PATENT DOCUMENTS 3,607,345  9/1971  Thomas ............................. 430/502
4,293,585  10/1981  Imada et al. ......................... 427/40

*Primary Examiner*—George F. Lesmes
*Assistant Examiner*—E. Rollins Buffalo
*Attorney, Agent, or Firm*—Toren, McGeady and Stanger

[57] ABSTRACT

The invention provides a novel method for the preparation of a composite shaped article of a vinyl chloride-based resin clad with a coating layer of polyvinyl alcohol without the use of any adhesive agent. The method comprises subjecting the surface of the shaped article to exposure to an atmosphere of low temperature atmosphere, coating the thus plasma-treated surface of the shaped article with an aqueous solution of a polyvinyl alcohol and drying. The coating layer of the polyvinyl alcohol thus formed is so firmly bonded to the surface of the vinyl chloride-based resin shaped article that various advantageous properties are imparted to the shaped article.

3 Claims, No Drawings

POLYVINYL ALCOHOL-CLAD SHAPED ARTICLE OF VINYL CHLORIDE RESIN

BACKGROUND OF THE INVENTION

The present invention relates to a composite shaped article of a vinyl chloride-based resin clad with a coating layer of a polyvinyl alcohol and a method for the preparation thereof.

Needless to say, vinyl chloride-based resins belong to one of the most important classes of thermoplastic resins owing to their very unique and versatile properties if not to mention their remarkable inexpensiveness in comparison with other thermoplastic resins. They have, however, some defective points presenting a drawback in their wider applications. For example, films of a polyvinyl chloride resin have relatively large gas permeability so that their use is not recommended when absolute shielding of gas permeation is essential.

Further, surfaces of shaped articles of a polyvinyl chloride resin are readily charged up with static electricity inducing deposition of dusts from the ambient environment to a loss of the surface beautifulness. Moreover, surfaces of shaped articles of vinyl chloride-based resins are sometimes not satisfactory with respect to the mechanical strengths, e.g. resistance against scratch, and resistance against chemicals. Therefore, it has been one of the important problems to improve surface properties of a shaped article of vinyl chloride-based resins in these respects.

Among several attempts hitherto made for solving the above problems, it is one of promising approaches that a shaped article of a vinyl chloride resin is clad or provided with a coating film of another kind of resin such as polyethylene, polypropylene, polyesters and the like by use of a suitable adhesive agent such as polyurethane-based ones. If setting aside the problem that curved or irregular surfaces are bonded with plain films of overcoating hardly or with extreme difficulty, this method is effective provided that the kind of the overcoating resin is properly selected and strong adhesive bonding is obtained between the overcoating resin and the polyvinyl chloride resin.

As a matter of course, a single kind of the overcoating resin cannot be a remedy for all defective properties desired to be improved of the vinyl chloride-based resin since an overcoating resin has its own defective points. Therefore it is a usual practice to select the overcoating resin in accordance with one or a few specific properties to be improved depending on the intended application of the shaped article. Accordingly, in these circumstances, it is sometimes desired that a shaped article of a vinyl chloride-based resin is clad with a polyvinyl alcohol so as to be able to utilize the unique properties inherently possessed by polyvinyl alcohols. Unfortunately, such a polyvinyl alcohol-clad shaped article of a vinyl chloride-based resin has not yet come to practical use due to the technical difficulties to obtain strong bonding between the surface of a polyvinyl chloride shaped article and a film of polyvinyl alcohol such as the absence of a suitable adhesive agent.

SUMMARY OF THE INVENTION

It is therefore an object of the present invention to provide a novel polyvinyl alcohol-clad composite shaped article of a vinyl chloride-based resin in which the overcoating layer of the polyvinyl alcohol is firmly bonded to the surface of the substrate shaped article of the vinyl chloride-based resin and never peeled off in practical use.

Another object of the present invention is to provide a novel and improved method for the preparation of a polyvinyl alcohol-clad composite shaped article of a vinyl chloride-based resin as mentioned above even without the use of an adhesive agent.

The method of the present invention comprises the steps of (a) subjecting the surface of a shaped article of a vinyl chloride-based resin to exposure to an atmosphere of low temperature plasma of a gas having no polymerizability in a plasma condition, (b) coating the thus plasma-treated surface of the shaped article of the vinyl chloride-based resin with an aqueous solution containing a polyvinyl alcohol dissolved therein, and (c) drying the aqueous solution of the polyvinyl alcohol on the surface of the shaped article of the vinyl chloride-based resin.

DETAILED DESCRIPTION OF THE PREFERRED EMBODIMENTS

The vinyl chloride-based resin of which the shaped article as the substrate body to be clad with a polyvinyl alcohol can be not only a homopolymeric polyvinyl chloride resin but also any kind of copolymeric resins of which the main monomeric component, say 50% by weight or more, is vinyl chloride. The comonomers to be copolymerized with vinyl chloride include those conventionally used ones such as vinyl esters, e.g. vinyl acetate and the like, acrylic and methacrylic acids and esters thereof, e.g. methyl methacrylate, ethyl acrylate and the like, acrylonitrile, vinylidene halides, e.g. vinylidene chloride and the like, maleic anhydride and olefins, e.g. ethylene, propylene and the like. The average degree of polymerization of the resin is not particularly limitative according to need.

The shaped articles to be clad with a polyvinyl alcohol according to the invention include both rigid type ones and plasticized flexible type ones obtained by formulating the vinyl chloride resin with a substantial amount of a plasticizer. In addition to the above mentioned plasticizer, the shaped articles may be formed by formulating the resin with those additive ingredients conventionally used in molding of vinyl chloride-based resins such as heat resistance improvers, lubricants, stabilizers, fillers, anti-oxidants, ultraviolet absorbers, anti-fogging agents, pigments, dyes and so on. Furthermore, the vinyl chloride-based resin is optionally admixed with a rubbery elastomer when improvements in the mechanical properties, e.g. impact strength, are desired of the articles shaped therewith. Such a rubbery elastomer is exemplified by copolymers of ethylene and vinyl acetate, copolymers of acrylonitrile and butadiene, copolymers of styrene and butadiene, copolymers of ethylene and propylene, ternary copolymers of ethylene, propylene and a dienic comonomer and the like. These rubbery elastomers are formulated in the resin blend in an amount not exceeding 50 parts by weight per 100 parts by weight of the vinyl chloride-based resin.

The shapes of the articles to be clad with a polyvinyl alcohol according to the inventive method are not limitative including films, sheets, plates, rods and pipes as well as any irregular forms in so far as uniform treatment of the surface thereof with low temperature plasma is ensured. This is a very advantageous feature of the inventive method in comparison with the prior art methods of bonding a pre-formed plastic film on to the surface of the polyvinyl chloride shaped articles not applicable to curved or irregular surfaces.

The first step of the inventive method is the exposure of the surface of the vinyl chloride-based resin shaped article to low temperature plasma of a gas having no polymerizability in the plasma condition under a pressure in the range from 0.001 Torr to 10 Torr. The low temperature plasma is readily generated in the gaseous atmosphere of the above specified pressure by applying a high frequency, e.g. 13.56 MHz, electric power of 10 to 500 watts to the electrodes effecting electric discharge through the atmosphere. Satisfactory results can be obtained either by the electrode discharge or by the electrodeless discharge. The optimum time for the plasma treatment may differ widely depending on the energy density of the plasma atmosphere but it is usually in the range from a few seconds to several tens of minutes.

It is of course that the frequency band for the electric discharge is not limited to the above mentioned high frequency region but may range from direct current to low frequency to microwave regions. The mode of the electric discharge is also not limitative including, in addition to the glow discharge, spark discharge and silent discharge. Exterior electrodes and inside electrodes as well as a coiled electrode may be used as the discharge electrode connected to the power supply by capacitive coupling or inductive coupling. At any rate, however, it is a requirement that the surface of the shaped article is never subject to the thermal denaturation by the heat evolved in the electric discharge.

What is meant by the term of a gas having no polymerizability in the plasma condition is a gas from which products with high molecular weights are not formed when low temperature plasma is generated in the low pressure atmosphere of the gas. Suitable gases are mostly inorganic exemplified by helium, neon, argon, nitrogen, nitrous oxide, nitrogen dioxide, oxygen, air, carbon monoxide, carbon dioxide, hydrogen, chlorine and hydrogen chloride. These gases are used either singly or as a mixture of two kinds or more. The pressure of the gaseous atmosphere in the plasma generating chamber is in the range from 0.001 Torr to 10 Torr or, preferably, from 0.01 Torr to 1 Torr in order to obtain stable plasma discharge.

The next step is coating the thus plasma-treated surface of the shaped article with an aqueous solution of a polyvinyl alcohol. Any kinds of polyvinyl alcohols may be used in the inventive method including completely saponified ones and partially saponified ones in so far as an aqueous solution of the polymer can be obtained. The average degree of polymerization or average molecular weight of the polyvinyl alcohol is also not limitative. These parameters of the polyvinyl alcohol should be determined according to the properties desired in the coating layer of the polyvinyl alcohol. The concentration of the polyvinyl alcohol in the aqueous solution is a factor ruling the thickness of the coating layer of the polyvinyl alcohol on the surface of the shaped article to e clad and hence should be determined according to need. Generally speaking, coating layers with sufficient protecting effects can hardly be obtained with an aqueous solution of a polyvinyl alcohol in a concentration of smaller than 0.1% by weight whereas an aqueous solution of a polyvinyl alcohol in a concentration exceeding several tens of % by weight is obtained with difficulties due to the limited solubility of the polymer in water. When a coating layer of a polyvinyl alcohol having a thickness in excess of that obtained with an aqueous solution of the polyvinyl alcohol of the maximum concentration is desired, it is recommended that coating with the solution is repeated several times with drying after each time of the coating.

Different from the surface of a vinyl chloride-based resin articles not treated with low temperature plasma, the plasma-treated surface of the vinyl chloride-based resin article is not repellent to an aqueous solution so that the aqueous solution of the polyvinyl alcohol can spread evenly on the surface regardless of the method for coating which can be dipping, brushing, spraying or any other suitable means. If not essential, the plasma-treated surface of the article is coated with the aqueous solution of the polyvinyl alcohol preferably as soon as possible after completion of the plasma treatment not to be influenced by a possible alteration in the favorable surface condition obtained by the plasma treatment. Practically, no noticeable changes are observed in the affinity of the surface to the aqueous solution of the polyvinyl alcohol when coating is performed within 24 hours after completion of the plasma treatment.

The shaped article coated with the aqueous solution of the polyvinyl alcohol is then dried so that the dried layer of the polyvinyl alcohol is firmly bonded to the surface of the article. This drying is performed at a temperature from room temperature to 130° C. or, preferably, from 50° to 70° C. At any rate, care must be taken not to cause thermal deformation of the shaped article of the vinyl chloride-based resin at an excessively high drying temperature. It is optional that drying is performed under a reduced pressure to accelerate evaporation of water. It should also be avoided that foaming or bubble formation takes place by the water vapor produced in the aqueous coating layer during drying.

The thickness of the polyvinyl alcohol coating layer is, as mentioned above, determined according to need and controllable with the concentration and viscosity of the aqueous coating solution of the polyvinyl alcohol. It is usually in the range from 1 to 1000 $\mu$m to be suitable for most of the desired applications.

The dried coating layer of the polyvinyl alcohol is firmly and integrally bonded to the surface of the shaped article of the vinyl chloride-based resin and no longer peeled off in an ordinary using condition of the article. This unexpectedly strong bonding even without the use of an adhesive agent is obtained presumably by the enhancement of the wettability, formation of functional groups and roughening on the surface treated with low temperature plasma.

Following are the examples to illustrate the present invention in further detail.

EXAMPLE 1

A resin composition composed of 100 parts by weight of a homopolymeric polyvinyl chloride resin having an average degree of polymerization of about 1000 (TK-1000, a product by Shin-Etsu Chemical Co., Japan), 1.5 parts by weight of calcium stearate and 1.5 parts by weight of zinc stearate was milled for 10 minutes in a roller at 180° C. and then shaped by compression molding at 185° C. into a sheet of 0.2 mm thickness.

This sheet was placed in an apparatus for plasma generation and low temperature plasma was generated in the chamber by the application of a 150 watts high frequency electric power at 13.56 MHz for 10 minutes so as that the surface of the resin sheet was exposed to the plasma atmosphere while the pressure of the atmosphere in the chamber was kept at 0.4 Torr by passing argon gas under reduced pressure.

The thus plasma-treated sheet of the resin was dipped in a 5% aqueous solution of a polyvinyl alcohol having an average degree of polymerization of about 1750 and a degree of saponification of about 99% (PVA C-17, a product by Shin-Etsu Chemical Co., Japan) and pulled up and air-dried to form a coating layer of the polyvinyl alcohol on the surface of the resin sheet. The thickness of this coating layer was about 30 $\mu$m as dried.

The polyvinyl alcohol-clad sheet of the vinyl chloride resin was subjected to the Erichsen test to find that the adhesion was perfect between the coating layer of the polyvinyl alcohol and the plasma-treated surface of the resin sheet and no peeling took place.

It was noted that the surface of the sheet of the vinyl chloride resin not treated with low temperature plasma was repellent to the aqueous solution of the polyvinyl alcohol so that no uniform coating could be obtained, if tried in the above described manner.

Comparative measurements were undertaken with an unclad sheet before plasma treatment and the polyvinyl alcohol-clad sheet of the vinyl chloride resin for the pencil hardness, oxygen permeability, surface resistivity and charge voltage by rubbing. The oxygen permeability was determined with a standard instrument according to ASTM. The surface resistivity was determined at 25° C. in an atmosphere of 60% relative humidity and the charge voltage by rubbing was determined after 30 seconds of rubbing with a cotton cloth in the same ambient conditions. The results of these measurements were as follows.

|  | Unclad sheet | Polyvinyl alcohol-clad sheet |
| --- | --- | --- |
| Pencil hardness | 2H | 3H |
| Oxygen permeability, ml/m$^2$.24 hours.atmosphere | 17.6 | less than 0.1 |
| Surface resistivity, ohm | $5 \times 10^{15}$ | $2 \times 10^{10}$ |
| Charge voltage by rubbing, volts | 4500 | 600 |

EXAMPLE 2

A resin composition composed of 50 parts of a homopolymeric polyvinyl chloride resin having an average degree of polymerization of about 700 (TK-700, a product by Shin-Etsu Chemical Co., Japan), 50 parts by weight of a copolymeric resin of vinyl chloride and vinyl acetate (SC-500T, a product by the same company), 5 parts by weight of an epoxy-based stabilizer (0-130P, a product by Adeka Argus Kagaku Co., Japan), 0.2 part by weight of calcium stearate and 1.0 part by weight of an organotin stabilizer (T-17MJ, a product by Katsuda Kako Co., Japan) was milled at 170° C. for 10 minutes in a roller and then shaped by compression molding at 175° C. into a sheet of 0.2 mm thickness.

This sheet was placed in an apparatus for plasma generation and low temperature plasma was generated in the chamber by the application of a 300 watts high frequency electric power at 13.56 MHz for 10 minutes so as that the surface of the resin sheet was exposed to the plasma atmosphere while the pressure of the atmosphere was kept at 0.6 Torr by passing a 10:90 by volume gaseous mixture of carbon monoxide and argon under reduced pressure.

The thus plasma-treated sheet of the resin was dipped in a 10% aqueous solution of a polyvinyl alcohol having an average degree of polymerization of about 500 and a degree of saponification of 98% or higher (PVA C-05, a product by Shin-Etsu Chemical Co.) and pulled up and air-dried followed by further drying at 60° C. for 24 hours. The thickness of the coating layer of the polyvinyl alcohol was about 80 $\mu$m as dried.

The trial of coating the same resin sheet before plasma treatment with the aqueous polyvinyl alcohol solution was unsuccessful due to the surface repellency of the vinyl chloride resin sheet.

The Erichsen test undertaken with the thus prepared polyvinyl alcohol-clad composite sheet gave a result as satisfactory as in the preceding example. The results of the measurements of the pencil hardness, surface resistivity and charge voltage by rubbing were as shown below together with the results for an unclad sheet before plasma treatment.

|  | Unclad sheet | Polyvinyl alcohol-clad sheet |
| --- | --- | --- |
| Pencil hardness | 2H | 3H |
| Surface resistivity, ohm | $5 \times 10^{14}$ | $3 \times 10^{10}$ |
| Charge voltage by rubbing, volts | 4500 | 450 |

EXAMPLE 3

A resin composition composed of 100 parts by weight of a homopolymeric vinyl chloride resin having an average degree of polymerization of about 700 (TK-700, a product by Shin-Etsu Chemical Co.), 0.2 part by weight of calcium stearate and 1.0 part by weight of an organotin stabilizer (M-101D, a product by Tokyo Fine Chemical Co., Japan) was milled in a roller at 170° C. for 10 minutes and shaped by compression molding at 180° C. into a sheet of 0.15 mm thickness.

This sheet was place in an apparatus for plasma generation and low temperature plasma was generated in the chamber by the application of a 500 watts high frequency electric power at 13.56 MHz for 10 minutes so as that the surface of the resin sheet was exposed for 5 minutes to the plasma atmosphere while the pressure of the atmosphere was kept at 0.2 Torr by passing argon gas under reduced pressure.

The thus plasma-treated sheet was dipped in a 2% aqueous solution of a polyvinyl alcohol having an average degree of polymerization of about 2000 and a degree of saponification of 99.5% or higher (PVA C-20, a product by Shin-Etsu Chemical Co.) and pulled up and air-dried to form a polyvinyl alcohol-clad composite sheet of the vinyl chloride resin. The thickness of the coating layer of the polyvinyl alcohol was about 15 $\mu$m as dried.

The trial of coating the same resin sheet before plasma treatment with the aqueous solution of the polyvinyl alcohol was unsuccessful due to the surface repellency of the vinyl chloride resin sheet.

The Erichsen test undertaken with the thus prepared polyvinyl alcohol-clad composite sheet gave a result as satisfactory as in Example 1. The results of the measurements of the pencil hardness, oxygen permeability, surface resistivity and charge voltage by rubbing carried out in the same manner as in Example 1 were as shown below. Together with the results for an unclad sheet before plasma treatment.

|  | Unclad sheet | Polyvinyl alcohol-clad sheet |
| --- | --- | --- |
| Pencil hardness | 2H | 3H |
| Oxygen permeability, ml/m$^2$.24 hours.atmosphere | 17.6 | less than 0.1 |
| Surface resistivity, ohm | 5 × 10$^{14}$ | 1 × 10$^{10}$ |
| Charge voltage by rubbing, volts | 4500 | 850 |

What is claimed is:

1. A method for the preparation of a composite shaped article of a vinyl chloride-based resin clad with a coating layer of a polyvinyl alcohol provided on the surface of the shaped article without an intervening layer of an adhesive agent which comprises the steps of
 (a) subjecting the surface of the shaped article of the vinyl chloride-based resin to exposure to an atmosphere of low temperature plasma of a gas having no polymerizability in plasma condition,
 (b) coating the thus plasma-treated surface of the shaped article with an aqueous solution containing a polyvinyl alcohol dissolved therein, and
 (c) drying the aqueous coating layer on the surface of the shaped article.

2. The method as claimed in claim 1 wherein the step of coating is performed within 24 hours after completion of the exposure to the atmosphere to low temperature plasma.

3. The method as claimed in claim 1 wherein the step of drying is performed at a temperature in the range from 50° to 70° C.

* * * * *